(12) United States Patent
Wang et al.

(10) Patent No.: US 7,284,176 B2
(45) Date of Patent: Oct. 16, 2007

(54) EXTERNALLY-LOADED WEIGHTED RANDOM TEST PATTERN COMPRESSION

(75) Inventors: Seongmoon Wang, Plainsboro, NJ (US); Srimat T. Chakradhar, Manalapan, NJ (US)

(73) Assignee: NEC Laboratories America, Inc., Princeton, NJ (US)

( * ) Notice: Subject to any disclaimer, the term of this patent is extended or adjusted under 35 U.S.C. 154(b) by 326 days.

(21) Appl. No.: 10/891,618

(22) Filed: Jul. 15, 2004

(65) Prior Publication Data

US 2006/0015787 A1 Jan. 19, 2006

(51) Int. Cl.
  *G01R 31/28* (2006.01)
  *G06F 17/50* (2006.01)
(52) U.S. Cl. .......................... 714/738; 716/4
(58) Field of Classification Search ........ 714/726–729, 714/732, 738, 739; 716/4, 21
  See application file for complete search history.

(56) References Cited

U.S. PATENT DOCUMENTS 6,701,476 B2 * 3/2004 Pouya et al. ................ 714/727

2004/0107395 A1 * 6/2004 Volkerink et al. ........... 714/732

OTHER PUBLICATIONS

"Built-in Test for Circuits with Scan Based on Reseeding of Multiple-polynomial Linear Feedback Shift Registers" by Hellebrand et al. This paper appears in IEEE Transactions on Computers, Publication Date: Feb. 1995 vol. 44, Issue: 2 On pp. 223-233.*
Hellebrand, S. et al., "Generation of Vector Patterns Through Reseeding of Multiple-Polynomial Linear Feedback Shift Registers", International Test Conference 1992.
Venkataraman, S. et al., "An Efficient BIST Scheme Based on Reseeding of Multiple Polynomial Linear Feedback Shift Registers", IEEE 1993.
Rajski, J. et al., "Embedded Deterministic Test for Low Cost Manufacturing Test", ITC International Test Conference 2002.
Synopsys, "DFT Compiler SoCBIST Deterministic Logic BIST, Technology Backgrounder", 2002 Synopsys, Inc.
Santarini, M., "SynTest Readies Scan-Test Data Compaction Tool", EETimes, 2002.
Konemann, B., "LFSR-Coded Test Patterns for Scan Designs", Proceedings of the European Test Conference, 1991.

* cited by examiner

*Primary Examiner*—Cynthia Britt

(57) ABSTRACT

The present invention is directed to a logic testing architecture with an improved decompression engine and a method of decompressing scan chains for testing logic circuits.

20 Claims, 7 Drawing Sheets

Deterministic test patterns 301

|   | $s_{15}\ s_{14}\ s_{13}\ s_{12}\ s_{11}$ | $s_{25}\ s_{24}\ s_{23}\ s_{22}\ s_{21}$ |
|---|---|---|
| $T_1$ | 0 x 1 x x | x x 1 x 1 |
| $T_2$ | 1 x x x 1 | 0 0 x x x |
| $T_3$ | x 1 x 0 x | 1 x 0 x 1 |
| $T_4$ | x 0 x 1 x | x x 1 0 x |

Random patterns (U-FLSR patterns) 302

|   | $s_{15}\ s_{14}\ s_{13}\ s_{12}\ s_{11}$ | $s_{25}\ s_{24}\ s_{23}\ s_{22}\ s_{21}$ |
|---|---|---|
| $R_1$ | 1 0 1 0 1 | 0 1 1 1 1 |
| $R_2$ | 0 0 1 0 0 | 0 0 1 1 0 |
| $R_3$ | 0 1 1 1 1 | 1 1 0 0 0 |
| $R_4$ | 0 0 1 1 0 | 1 0 1 0 1 |

F-LFSR 303

|   | $s_{15}\ s_{14}\ s_{13}\ s_{12}\ s_{11}$ | $s_{25}\ s_{24}\ s_{23}\ s_{22}\ s_{21}$ |
|---|---|---|
| $F_1$ | 0 0 1 0 1 | 0 1 0 1 1 |
| $F_2$ | 1 0 1 1 1 | 0 1 1 1 0 |
| $F_3$ | 1 1 1 0 0 | 1 1 0 0 1 |
| $F_4$ | 1 0 0 1 0 | 0 0 1 0 1 |

S-LFSR 304

|   | $s_{15}\ s_{14}\ s_{13}\ s_{12}\ s_{11}$ | $s_{25}\ s_{24}\ s_{23}\ s_{22}\ s_{21}$ |
|---|---|---|
| $S_1$ | 1 0 1 0 0 | 0 1 0 0 1 |
| $S_2$ | 1 0 0 1 1 | 0 0 1 1 1 |
| $S_3$ | 0 1 1 1 0 | 1 1 1 0 1 |
| $S_4$ | 1 1 0 1 0 | 1 0 1 0 0 |

Altered test patterns 305

|   | $s_{15}\ s_{14}\ s_{13}\ s_{12}\ s_{11}$ | $s_{25}\ s_{24}\ s_{23}\ s_{22}\ s_{21}$ |
|---|---|---|
| $A_1$ | 0 0 1 0 1 | 0 1 1 1 1 |
| $A_2$ | 1 0 1 1 1 | 0 0 1 1 0 |
| $A_3$ | 0 1 1 0 1 | 1 1 0 0 1 |
| $A_4$ | 1 0 1 1 0 | 0 0 1 0 1 |

FIG. 3

|     | $s_{15}$ | $s_{14}$ | $s_{13}$ | $s_{12}$ | $s_{11}$ | $s_{25}$ | $s_{24}$ | $s_{23}$ | $s_{22}$ | $s_{21}$ |
|-----|---|---|---|---|---|---|---|---|---|---|
| $t_1$ | 0 | x | 1 | x | x | x | x | 1 | x | 1 |
| $t_2$ | x | 1 | x | 0 | x | x | 1 | x | 0 | x |
| $t_3$ | 0 | 0 | 1 | 1 | x | x | 0 | 1 | 1 | 1 |
| $G_1$ | 0 | u | 1 | u | x | x | u | 1 | u | 1 |

FIG. 7

EXTERNALLY-LOADED WEIGHTED RANDOM TEST PATTERN COMPRESSION

BACKGROUND OF THE INVENTION

The present invention is related to testing of logic circuit designs, in particular in the context of compression of test patterns for logic testing.

Testing of complicated digital logic circuits requires the generation of large test patterns. Unfortunately, the sizes of scan test patterns for today's large designs can be even larger than the sizes of typical tester memory. This necessitates multiple loading of test patterns during a test application and, in turn, increases test application time and test cost. The oversized test pattern set problem is even more severe in delay testing, which has become a necessary test procedure for deep-sub micron chips. Delay test set sizes are often significantly larger than memory capacities of inexpensive testers. Test set sizes and test application times are major factors that determine the test cost of an integrated circuit.

One technique for addressing the issue is to compress the test data. It has been proposed, for example, to use reseeding of a pseudo-random pattern generator (such as a linear feedback shift register), to encode test cubes of difficult to test faults. See B. Könemann, "LFSR-coded Test Patterns for Scan Designs," *Proc. Of European Test Conf.*, pp. 237-42 (1991). LFSR reseeding has been used for some time to improve fault coverage for random patterns resistant circuits in built-in self-test (BIST). A number of companies have begun to offer test data compaction tools that take advantage of encoding and reseeding techniques to reduce the size of large test patterns—such as Mentor Graphics Embedded Deterministic Test (EDT), Syntest VirtualScan, and Synopsys DBIST/XDBIST. See, e.g., J. Rajski et al., "Embedded Deterministic Test for Low Cost Manufacturing Test," in Proc. International Test Conference, pp. 301-310 (2002). In general, however, such prior art test compression schemes generate one test pattern from one seed. For example when using either Mentor Graphics EDT or Syntest VirtualScan, one compressed pattern corresponds to one test cube. Syntest VirtuaScan compresses test set sizes by broadcasting: one single test pattern can be shared among multiple scan chains. In order to achieve significant compression rates, typical lengths of scan chains should be split into a larger number of short scan chains. This can result in high routing overhead. Synopsys DBIST/XDBIST does generate a fixed number of test patterns from each seed; however, the additional generated test patterns are not guaranteed to detect any new faults, thereby resulting in disadvantageous increases in test application time.

Accordingly, there is a need for improved test pattern compression which can achieve greater compression rates without unduly increasing test application times.

SUMMARY OF INVENTION

The present invention is directed to a logic testing architecture that is capable of reusing seeds to generate multiple test patterns. In accordance with an embodiment of the present invention, the decompression engine comprises three pseudo-random pattern generators, such as linear feedback shift registers. Two out of the three pseudo-random pattern generators are seeded while the third pseudo-random pattern generator can be free running. The three pseudo-random pattern generators have outputs which are combined so as to generate values which are inserted into one or more scan chains. For example, the three pseudo-random pattern generators can be combined using a selection circuit which selects values for the scan chain from either a seeded pseudo-random pattern generator or the free running pseudo-random pattern generator, based on a value from the other seeded pseudo-random pattern generator. The selection circuit can be readily implemented, for example, using a multiplexer or a circuit comprising an AND gate and an OR gate.

The seed can be advantageously chosen so as to specify deterministic test patterns for the scan chain. The seed need only be chosen so as to affect the values in the scan chain that will deviate from the desired deterministic test pattern, as generated for example by automatic test pattern generator. The compression ratio and the hardware overhead of the embodiment will depend on the number of changes that are needed to alter the free running pseudo-random pattern generator to the desired deterministic pattern. In accordance with another embodiment of the present invention, the two seeded patterns can be generated from a single pseudo-random pattern generator based on a single seed. Moreover, additional layers of compression can be inserted between the decompression engine and the automatic test equipment.

Unlike other reseeding based methods where one seed is used to generate one test pattern, the present invention can reuse seeds for many test patterns all of which can detect at least one new fault. Hence, it can potentially achieve greater compression rate with test application time. These and other advantages of the invention will be apparent to those of ordinary skill in the art by reference to the following detailed description and the accompanying drawings.

BRIEF DESCRIPTION OF DRAWINGS

FIG. 3 is a set of illustrative test patterns corresponding to the example shown in FIG. 2.

FIG. 7 shows how a generator is computed from a set of test patterns.

DETAILED DESCRIPTION

Figure 1:
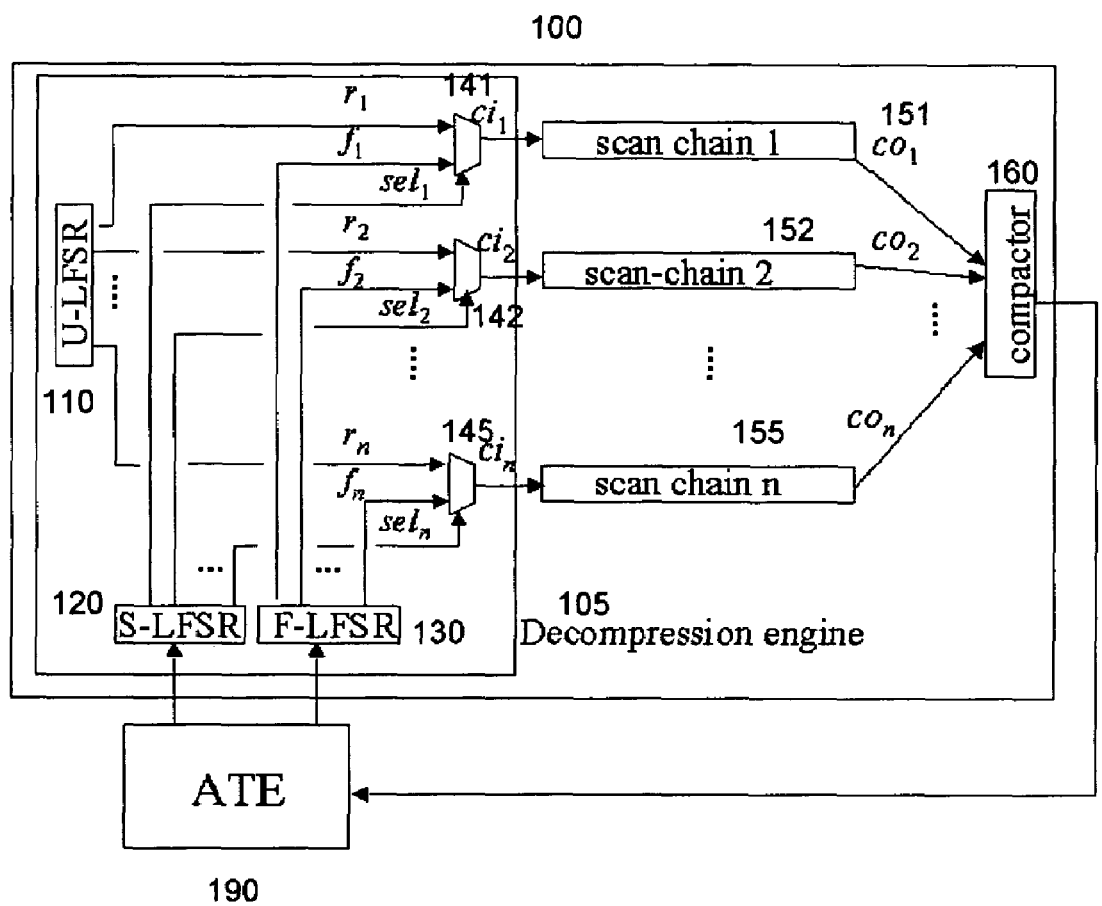
FIG. 1 is a diagram illustrating a decompression architecture in accordance with an embodiment of the present invention.

FIG. 1 is a diagram illustrating a decompression architecture 100 in accordance with an embodiment of the present invention. The decompression engine 105 comprises three linear feedback shift registers (LFSRs), namely, U-LFSR 110, F-LFSR 120, and S-LFSR 130, and n multiplexers (2 to 1 multiplexers) 141, 142, . . . 145, where n is the number of scan chains 151, 152, . . . 155 in the circuit. The U-LFSR 110 is a free running LFSR and generates pure pseudo-random pattern sequences. One input of each multiplexer connects to an output of the U-LFSR 110 and the other input connects to an output of the F-LFSR 120. The F-LFSR 120 and the S-LFSR 130 are re-loadable, i.e. a new seed can be loaded into these LFSRs from external automatic test equipment (ATE) 190 whenever it is necessary to change test pattern sequences. Outputs of the S-LFSR 120 drive select inputs of the n multiplexers; if the select input of a multiplexer is set to a 0 at a scan shift cycle, a random value, which is generated by the U-LFSR 110, is scanned into the scan chain that connects to the output of the multiplexer and if the select input of the multiplexer is set to a 1, a value generated by the F-LFSR 130 is scanned into the scan chain.

The seeds for the S-LFSR 120 and the F-LFSR 130 are preferably computed from deterministic test cubes and U-LFSR patterns. A special automatic test pattern generation (ATPG) technique can be used to generate deterministic test patterns that are suitable to maximize compression rate and minimize hardware overhead. Each pair of seeds that is loaded into the S-LFSR 120 and the F-LFSR 130 is used to generate a set of test patterns. The number of test patterns generated by each seed is determined during the seed calculation step.

Figure 2:
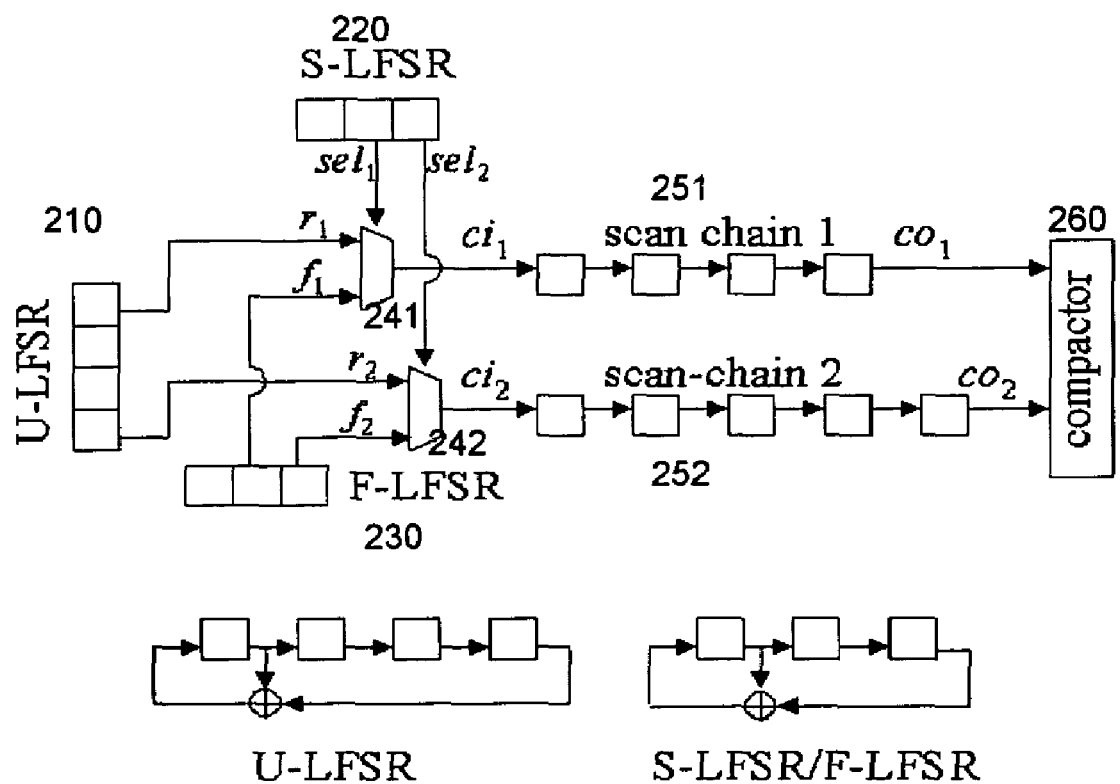
FIG. 2 further illustrates the decompression architecture shown in FIG. 1 using an example circuit with two scan chains.

FIG. 2 further illustrates the decompression architecture using an example circuit with two scan chains. The decompression engine consists of a 4 stage U-LFSR 210, a 3 stage S-LFSR 220, and a 3 stage F-LFSR 230. Feedback polynomials of the LFSR are shown below the circuit. Assume that we want to apply the four deterministic test patterns shown in the table 301 labeled "Deterministic test pattern" of FIG. 3 to the circuit by using the decompression engine. If the U-LFSR is initialized with all 1's and the test sequences generated by the U-LFSR are directly loaded into the scan chains without being altered by the decompression engine, then the two scan chains will be loaded with patterns shown in the table right hand side of the deterministic test pattern table of FIG. 3. U-LFSR pattern values that conflict with determinist test patterns in the same rows are highlighted with underlines. Those conflicting values are altered by the decompression engine to apply the desired deterministic test patterns to the scan chains.

Consider altering random pattern $R_1$ by using the decompression engine to apply a pattern to the scan chains that can be covered by deterministic pattern $T_1$. $T_1$ has four specified bits (care bits): $s_{15}$, $s_{13}$, $s_{23}$, and $s_{21}$ and among them only $s_{15}$ conflicts with its corresponding random pattern $R_1$. Hence, the random value generated by the U-LFSR should be altered at the scan shift cycle when the value for $s_{15}$ is scanned into scan chain 1 to detect all the faults that are targeted by $T_1$. Since U-LFSR patterns for the other scan inputs $s_{13}$, $s_{23}$, and $s_{21}$ are equivalent to deterministic test patterns, U-LFSR patterns for those scan inputs can be directly scanned into the scan chains without being altered. If the F-LFSR value and the U-LFSR value at a scan shift cycle are equivalent, then S-LFSR value during the scan shift cycle is "don't care". For example, since $f_2$ is assigned a 1 and $r_2$ is also assigned a 1 at the cycle when the value for $s_{21}$ is scanned into the scan chain 2 (521 is assigned a 1 in both $F_1$ and $R_1$), the value at selection signal $sel_2$ is a "don't care" (since whether $sel_2$ is assigned a 0 or 1, a 1 is scanned into the scan chain 1). In contrast, for the cycles when desired deterministic test pattern values are not identical to F-LFSR values but only identical to U-LFSR values, the S-LFSR values should be specified to 0's to select the U-LFSR values (random pattern values). For example, scan input $s_{23}$ is assigned a 1 in deterministic pattern $T_1$ but assigned a 0 in $F_1$. Hence, $sel_2$ should be set to a 0 to scan in the value generated by the U-LFSR when the value for $s_{23}$ is scanned into scan chain 2.

Since the compression ratio and hardware overhead for this embodiment of the present invention depends on the number of specified inputs in the F-LFSR patterns and the S-LFSR pattern, it is important to maximize the "don't cares", i.e., minimize the number of specified inputs. The values that must be satisfied by F-LFSR and S-LFSR patterns to apply desired values to the scan chains are underlined in the F-LFSR pattern table 303 and the S-LFSR pattern table 304. When the F-LFSR is loaded with seed 011 and the S-LFSR is loaded with seed 001, the decompression engine can generate test patterns that alter U-LFSR patterns to the desired deterministic patterns. In this simple example, the pair of seeds are used to generate 4 deterministic patterns. The table 305 with caption "Altered test patterns" shows test patterns that are applied to the scan chains.

The required stages of the F-LFSR (S-LFSR) are determined by the number of specified values, i.e., values that must be satisfied in the F-LFSR pattern (S-LFSR pattern) that has the most number of specified bits. If the number of specified bits in the pattern that has the maximum number of specified bits among all F-LFSR patterns is $S_{max}$, then the required stages for the F-LFSR is $S_{max}+20$.

Each deterministic pattern shown in FIG. 3 can be replaced by a generator that is computed from a set of test patterns that are generated by an ATPG. FIG. 7 shows how generator $G_1$ is computed from a set of test patterns $t_1$, $t_2$, and $t_3$. $s_{15}$ is always assigned 0 or x but never assigned 1 in $t_1$, $t_2$, and $t_3$. Hence, fixing $s_{15}$ to 0 can still detect all faults that are detected $t_1$, $t_2$, and $t_3$. In contrast, $s_{14}$ is assigned 1 in $t_2$ but assigned 0 in $t_3$. Hence, if we set $s_{14}$ to 0 (1), then faults that are detected by $t_2$ ($t_3$) may not be detected. Hence, $s_{14}$ cannot be fixed. On the other hand, $s_{13}$ is assigned only 1 and x but never assigned 0 $t_1$, $t_2$, and $t_3$. Hence, $s_{13}$ can be fixed to 1 without making any fault that is detected by $t_1$, $t_2$, and $t_3$ undetectable. Inputs that are always assigned x such as $s_{11}$ are assigned x. A seed that is computed for generator $G_1$ will be used to generate three test patterns that can detect all faults that are detected by $t_1$, $t_2$, and $t_3$. Since multiple test patterns are generated by a single seed, we can achieve even higher compression ratio by using generators instead of individual test patterns.

Figure 4:
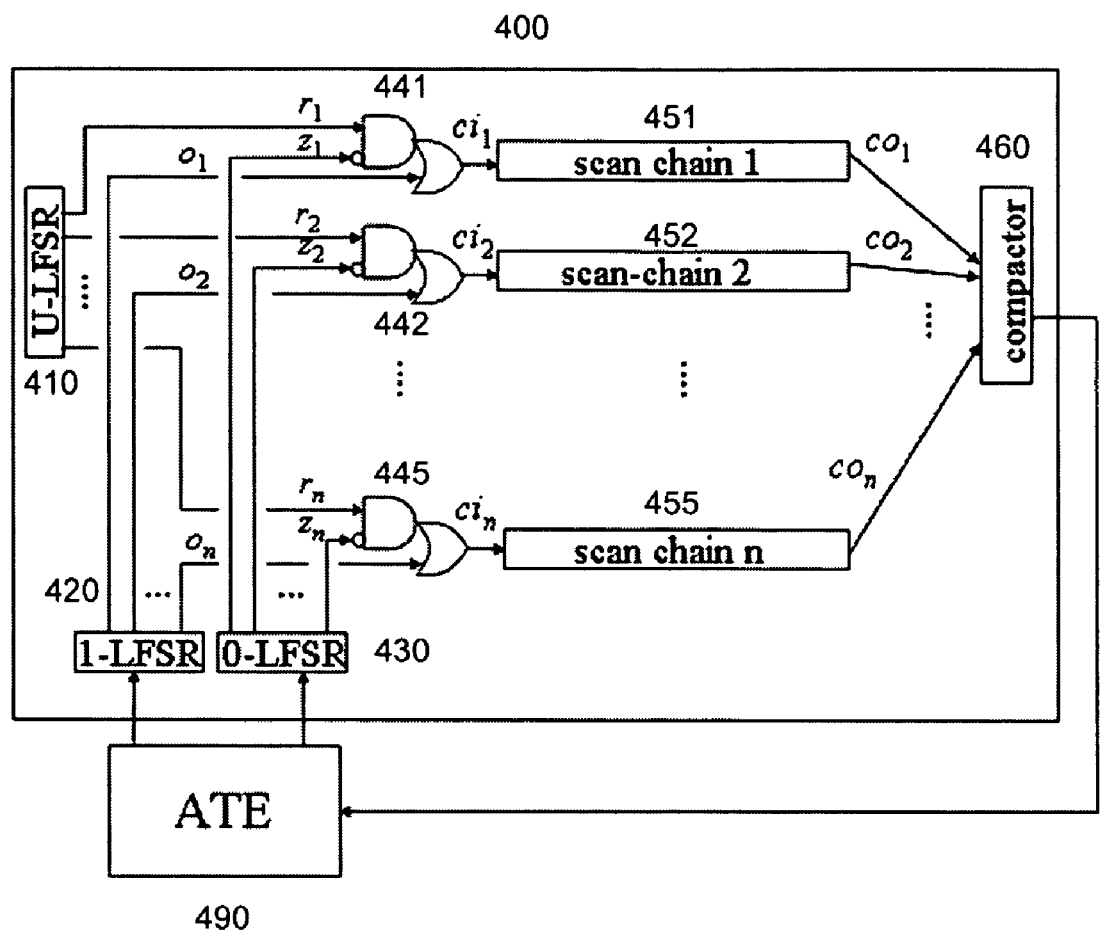
FIG. 4 is a diagram illustrating a decompression architecture in accordance with another embodiment of the present invention.

FIG. 4 shows a variant of the present invention. The decompression engine of this scheme comprises three LFSRs, U-LFSR 410, 0-LFSR 430, and 1-LFSR 420, and n fixing logics 441, 442, . . . 445, where n is the number of scan chains in the circuit. The S-FLSR and the F-FLSR of the scheme shown in FIG. 1 are replaced by the 0-LFSR 430 and the 1-LFSR 430 and n multiplexers are replaced by n fixing logics 441, 442, . . . 445. Each fixing logic consists of an AND gate and an OR gate. If a U-LFSR value needs to be altered to a 1 at a scan shift cycle, then corresponding $o_i$, where i=1,2, . . . , n, should be set to a 1 by the 1-LFSR. Similarly, if a U-LFSR value needs to be altered to a 0, then corresponding $z_i$ should be set to a 1 by the 0-LFSR and $o_i$ should be set to a 0 by the 1-LFSR.

Figure 5:
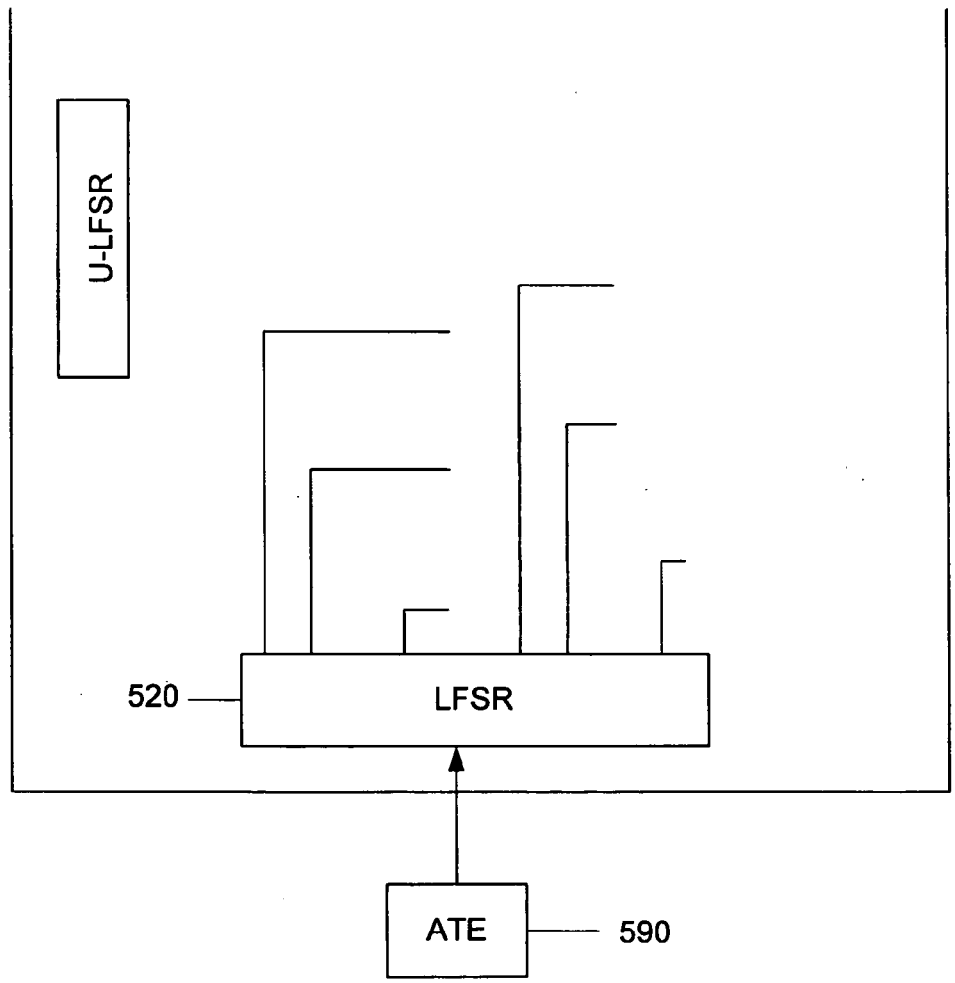
FIG. 5 is a diagram illustrating a decompression architecture in accordance with another embodiment of the present invention.

FIG. 5 illustrates another variant of the present invention. The two seeded LFSRs have been combined into a single longer LFSR 520 which accepts a single longer seed from the ATE 590. The single LFSR 520 generates all of the outputs provided by the two LFSRs.

Figure 6:
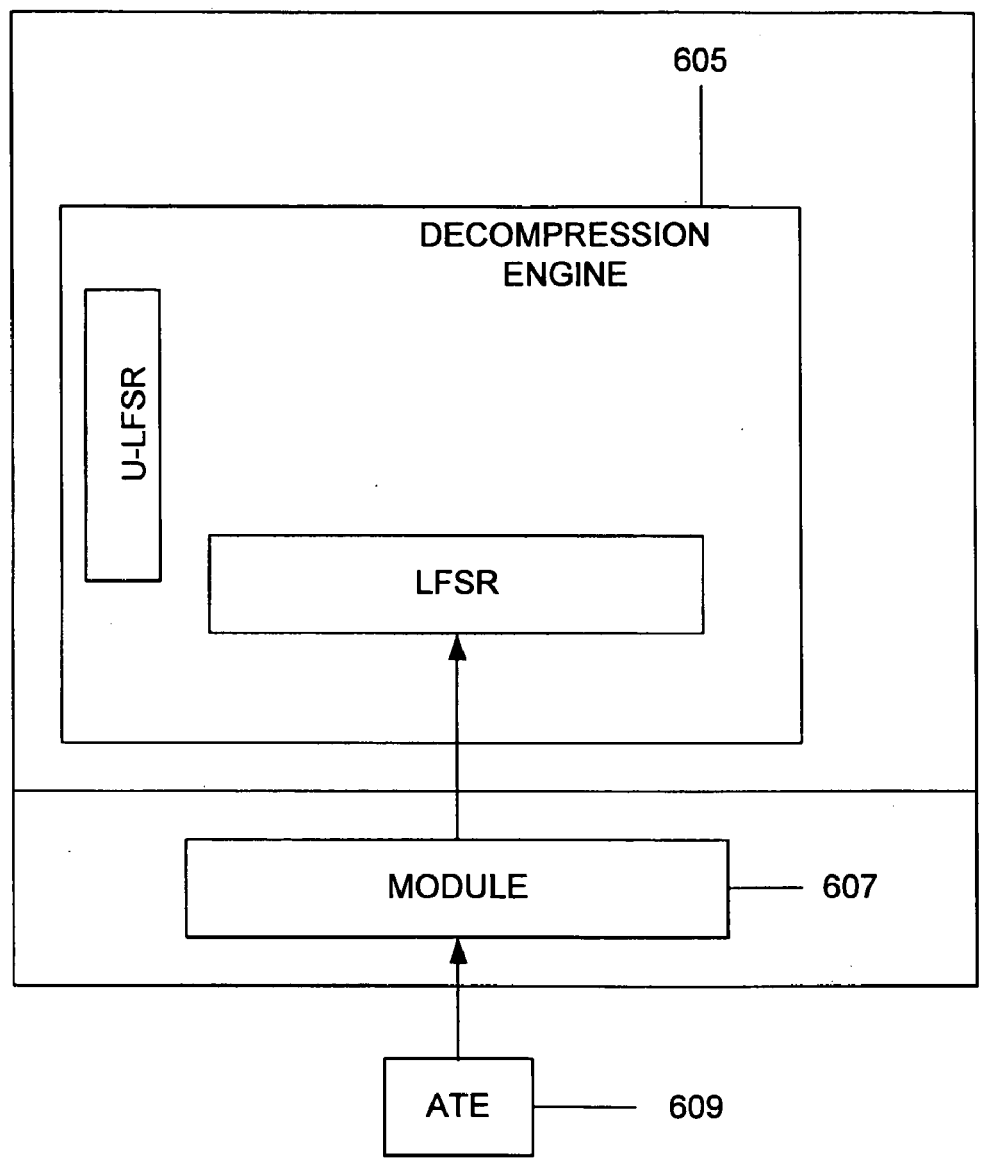
FIG. 6 is a diagram illustrating a decompression architecture in accordance with another embodiment of the present invention.

FIG. 6 illustrates another variant of the present invention. An additional layer of compression is provided at 607 between the decompression engine 605 and the ATE 690. The module 607 can be, for example, another decompression engine that lies off-chip as a component of the ATE 690.

While exemplary drawings and specific embodiments of the present invention have been described and illustrated, it is to be understood that that the scope of the present invention is not to be limited to the particular embodiments discussed. Thus, the embodiments shall be regarded as illustrative rather than restrictive, and it should be understood that variations may be made in those embodiments by workers skilled in the arts without departing from the scope of the present invention as set forth in the claims that follow and their structural and functional equivalents. As but one of many variations, it should be understood that pseudo-random pattern generators other than linear feedback shift registers can be readily utilized in the context of the present invention.

What is claimed is:

1. A logic testing architecture comprising:
   one or more scan chains; and
   a decompression engine which further comprises
      a first pseudo-random pattern generator that generates a first pattern sequence based on a first seed;
      a second pseudo-random pattern generator that generates a second pattern sequence based on a second seed;
      a third pseudo-random pattern generator that freely generates a third pattern sequence; and
      a selection circuit which, based on a value in the first pattern sequence, selects a value to insert into the scan chains from either the second pattern sequence or the third pattern sequence, thereby inserting a deterministic test pattern into the scan chains as determined by the first and second seed.

2. The logic testing architecture of claim 1 wherein the pseudo-random pattern generators are linear feedback shift registers.

3. The logic testing architecture of claim 1 wherein the selection circuit comprises a multiplexer per scan chain.

4. The logic testing architecture of claim 1 wherein the selection circuit comprises an AND gate and an OR gate per scan chain.

5. The logic testing architecture of claim 1 wherein the first and second pseudo-random pattern generators are a first and second portion of a larger pseudo-random pattern generator.

6. The logic testing architecture of claim 1 wherein the first and second seeds are loaded from automatic test equipment and wherein the first and second seeds are calculated from deterministic test patterns generated by the automatic test pattern generator.

7. The logic testing architecture of claim 6 wherein an extra layer of compression is inserted between the decompression engine and the automatic test equipment.

8. The logic testing architecture of claim 7 wherein the pseudo-random pattern generators are linear feedback shift registers.

9. The logic testing architecture of claim 7 wherein the outputs of the three random pattern generators are combined so as to allow the output of one of the pseudo-random pattern generators select which of the outputs of the other two pseudo-random pattern generators to insert into the scan chain.

10. The logic testing architecture of claim 1 wherein the first and second seeds are loaded from automatic test equipment.

11. The logic testing architecture of claim 10 wherein an extra layer of compression is inserted between the decompression engine and the automatic test equipment.

12. The logic testing architecture of claim 1 wherein the pseudo-random pattern generators are linear feedback shift registers.

13. The logic testing architecture of claim 1 wherein the selection circuit comprises a multiplexer per scan chain.

14. The logic testing architecture of claim 1 wherein the selection circuit comprises an AND gate and an OR gate per scan chain.

15. The logic testing architecture of claim 1 wherein the seed is loaded from automatic test equipment and wherein the seed is calculated from deterministic test patterns generated by the automatic test pattern generator.

16. The logic testing architecture of claim 15 wherein an extra layer of compression is inserted between the decompression engine and the automatic test equipment.

17. A logic testing architecture comprising:
    one or more scan chains; and
    a decompression engine comprising:
       three pseudo-random pattern generators, the three pseudo-random pattern generators having outputs which are combined so as to generate values which are inserted into the scan chains wherein:
          at least a first and second seed are input to two of the three pseudo-random pattern generators, respectively, so as to specify a deterministic test pattern for the scan chain.

18. A logic testing architecture comprising:
    one or more scan chains; and
    a decompression engine which further comprises
       a first pseudo-random pattern generator that generates a first and second pattern sequence based on a seed;
       a second pseudo-random pattern generator that freely generates a third pattern sequence; and
       a selection circuit which, based on a value in the first pattern sequence, selects a value to insert into the scan chains from either the second pattern sequence or the third pattern sequence, thereby inserting a deterministic test pattern into the scan chains as determined by the seed.

19. A method comprising the steps of:
    receiving a deterministic test pattern;
    computing a seed from the deterministic test pattern;
    generating a first pseudo-random pattern sequence and a second pseudo-random pattern sequence based on the seed; and,
    selecting a value to insert into a scan chain from either the second pseudo-random pattern sequence or a third freely-generated pseudo-random pattern sequence with the first pseudo random pattern sequence.

20. The method of claim 19 wherein the pseudo-random pattern generator is a linear feedback shift register.

* * * * *